United States Patent [19]

Ernst

[11] 4,070,611

[45] Jan. 24, 1978

[54] GYROMAGNETIC RESONANCE FOURIER TRANSFORM ZEUGMATOGRAPHY

[75] Inventor: Richard R. Ernst, Winterthur, Switzerland

[73] Assignee: Varian Associates, Inc., Palo Alto, Calif.

[21] Appl. No.: 787,112

[22] Filed: Apr. 13, 1977

Related U.S. Application Data

[63] Continuation of Ser. No. 559,479, March 18, 1975, abandoned.

[51] Int. Cl.² ............................................. G01R 33/08
[52] U.S. Cl. ................................. 324/.5 A; 324/.5 R
[58] Field of Search ............... 324/.5 R, .5 MA, .5 H, 324/.5 A, .5 AC

[56] References Cited

U.S. PATENT DOCUMENTS

| | | | |
|---|---|---|---|
| 4,015,196 | 3/1977 | Moore et al. | 324/.5 R |
| 4,021,726 | 5/1977 | Garroway | 324/.5 R |

*Primary Examiner*—M. Tokar
*Attorney, Agent, or Firm*—Stanley Z. Cole; Gerald M. Fisher; E. H. Berkowitz

[57] ABSTRACT

An improved technique is disclosed for forming two- or three-dimensional images of a macroscopic sample by means of gyromagnetic resonance. A train of free induction decay transient resonance signals are induced and detected from a sample in a region to be imaged. A sequence of pulsed magnetic field gradients are applied during the series of free induction decay signals to derive sets of gyromagnetic resonance data as a function of the changing magnetic field gradients. Two- or three-dimensional images are reconstructed from the sets of resonance data by two- or three-dimensional Fourier transformation.

28 Claims, 9 Drawing Figures

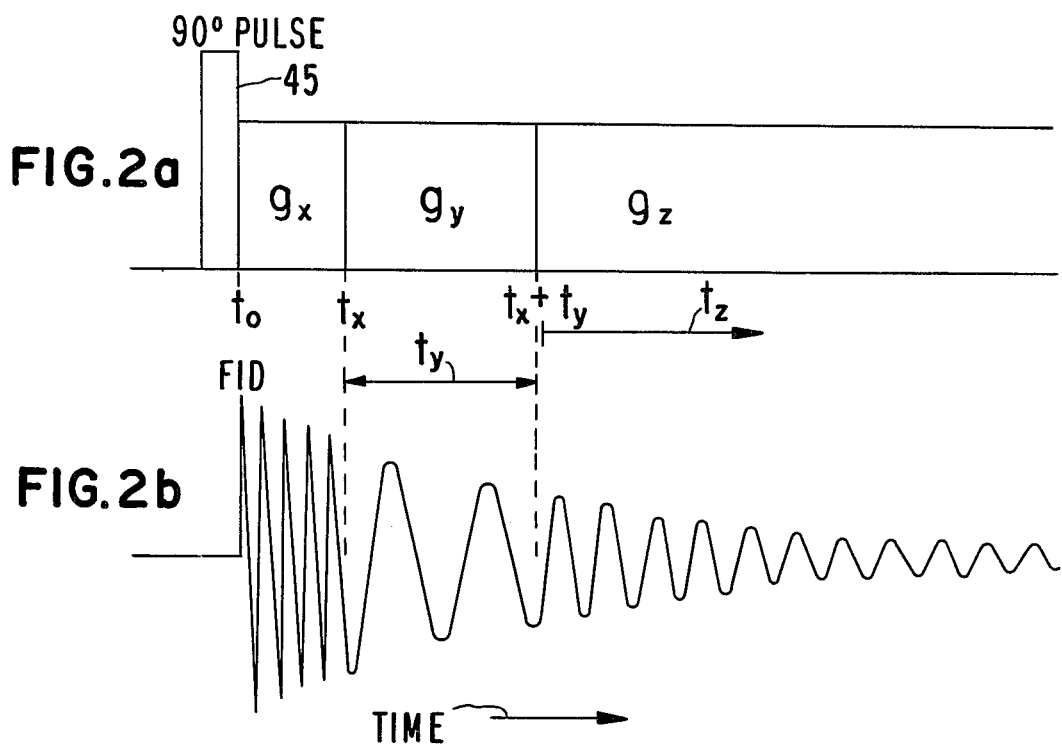
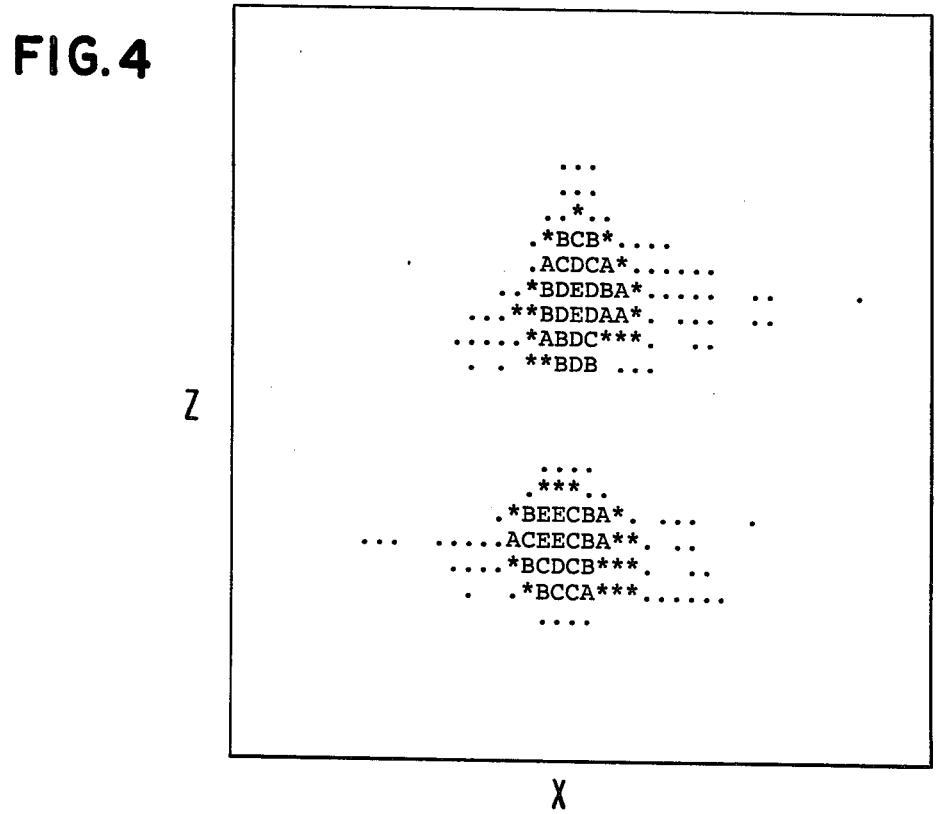

FIG.6

```
              .*AA**..   .ABBA**..........  . .
..........***ADDDDB.  .*CEDBAA******..........
..  .......***ACEEEDA. .ACDCBA**....
..  .   .....**ABCBA*   .*BCBAA**......
              ..*AA**.   *ABBA*....  ...
                ....      ....
                  .        ....
                            ..
```
X

```
                ....
                .....
                ......
                ......
             *ABBBA**.    ....
           . *BBCCBA*.    ..... .
        ....ADDDDCBA*.   ......        .
         ..BEEDEDBAA.  .**...    . ..
      .   .....BEDCCCBAA.  .*... .
           ......*BBBBBBAA*.   .....
              ............
                ........
                 .....
                .. ....
                .......
                .......
                ..***..
               *ABCBA**..
            .. .ABCCA**....  ...
      .    .... *ACDCA*....     ....
       .   .... .**CDCA*...
              ........*CCBA**..
                 .*.....
```
Z

X

GYROMAGNETIC RESONANCE FOURIER TRANSFORM ZEUGMATOGRAPHY

This is a continuation of application Ser. No. 559,479 filed Mar. 18, 1975, and now abandoned.

BACKGROUND OF THE INVENTION

The present invention relates in general to image formation by detecting gyromagnetic resonance of a sample in a region of space to be imaged and exposed to a magnetic field gradient and, more particularly, to an improved method and apparatus for obtaining such images wherein the data for constructing such images is derived by inducing a train of free induction decay gyromagnetic resonances of the sample within such a region to be imaged.

DESCRIPTION OF THE PRIOR ART

Heretofore, it has been proposed to obtain an image (graphical representation of the spatial distribution of one or more of the properties) of an object or region by inducing and detecting nuclear magnetic resonance of a sample in the region to be imaged. In this prior method, a linear magnetic field gradient is produced across the region of the object occupied by the gyromagnetic resonance sample. A resonance spectrum is obtained for each of a relatively large number of angularly displaced orientations of the linear magnetic gradient through the sample region of the object to be imaged.

The image is constructed by a mathematical process of back projection of the spectral data through a two-dimensional or three-dimensional matrix to derive a two-dimensional or three-dimensional image of the object or region of space. Such a method for obtaining images has been referred to in the art as zeugmatography. It is believed that this method of zeugmatography will be useful for generating pictures of the distribution of stable isotopes, such as hydrogen or deuterium, within an object. Relative intensities in an image are made to depend upon relative nuclear relaxation times. Variations in water content and proton relaxation times among biological tissue should permit the generation, with field gradients large compared to internal magnetic inhomogeneities, of useful zeugmatographic images from the rather sharp water resonances of organisms, selectively picturing the various soft structures and tissues of the body.

A possible application of considerable interest at this time would be the in vivo study of malignant tumors, which have been shown to give proton nuclear magnetic resonance signals with much longer water spin-lattice relaxation times than those in the corresponding normal tissues. In short, zeugmatographic techniques should find many useful applications in studies of the internal structures, states, and compositions of microscopic and macroscopic objects. Such a prior art technique of zeugmatography is disclosed in an article titled "Image Formation by Induced Local Interactions: Examples Employing Nuclear Magnetic Resonance" appearing in *Nature*, Vol. 242 of Mar. 16, 1973 at pages 190-191.

One of the problems with the aforecited method of gyromagnetic resonance zeugmatography is that the image construction technique utilizes the fact that the Fourier transform of a one-dimensional projection of the spin density represents a one-dimensional cross section of the three-dimensional Fourier transform of the spin density function. All the cross sections which can be obtained in this way pass through the point $\omega=0$. The density of data points of the obtained samples, therefore, is maximum for $\omega=0$ and decreases for increasing $\omega$. To obtain equally spaced samples representing the Fourier transform, it is at first necessary to go through an interpolation procedure. This is a prerequisite for the execution of the inverse Fourier transform which produces the desired image. This ultimately implies that the low frequency components are obtained with higher precision than the high frequency components of the zeugmatogram. Therefore, the coarse features are better represented than the details. In some cases, this may be no disadvantage, and it may, in particular cases, even be desirable. This feature is inherent and is independent of the reconstruction procedure used.

In addition, this prior method of image reconstruction is relatively complex and requires relatively large quantities of data to be stored in the memory of the image computer.

Therefore it is desired to provide an improved method of gyromagnetic resonance zeugmatography which has less computational complexity and which yields a homogeneous error distribution of the entire space such that low and high frequency components can be reconstructed with equal accuracy.

SUMMARY OF THE PRESENT INVENTION

The principal object of the present invention is the provision of an improved method of gyromagnetic resonance zeugmatography and more particularly to such a method employing a train of free induction decay resonance signals.

In one feature of the present invention, gyromagnetic resonance zeugmatography is performed by modifying a train of free induction decay resonance signals as a function of the changing orientation of a superimposed magnetic field gradient to derive gyromagnetic resonance data in the time domain from which a graphical representation of the spatial distribution of a property of the sample region may be derived by suitable reconstruction computations.

In another feature of the present invention, the orientation of the magnetic field gradient relative to the sample region is changed during each of the free induction decay transient resonance signals.

In another feature of the present invention, the orientation of the magnetic field gradient is changed so that it is directed in each of three orthogonal directions during each of the free induction decay resonances of the sample.

In another feature of the present invention, the absorption mode component of the free induction decay signals is detected independently of the dispersion mode resonance signal to derive absorption mode resonance data from which to derive a graphical representation of the spatial distribution of a property of the sample region.

In another feature of the present invention, a second magnetic field gradient of higher order than a first gradient, which is applied to the sample during the free induction decay resonances, is applied to the sample region to smear out the resonance of volume elements of the sample region disposed away from a desired plane defined by the second field gradient.

In another feature of the present invention, the free induction decay resonances are preconditioned by substantially inverting the alignment of the gyromagnetic resonators prior to inducing each of the free induction decay signals.

In another feature of the present invention, each of the free induction decay resonance signals is preconditioned by saturating the resonances of the gyromagnetic resonators prior to inducing each of the transient free induction decay signals.

Other features and advantages of the present invention will become apparent upon a perusal of the following specification taken in connection with the accompanying drawings wherein:

BRIEF DESCRIPTION OF THE DRAWINGS

FIG. 2 is a composite waveform diagram depicting in waveform (a) the time sequence of application of RF magnetic field and linear magnetic field gradients to the sample to produce the free induction decay signal of waveform (b)

FIG. 4 is a zeugmatogram obtained from the data partially shown in FIG. 3,

FIG. 7 is a zeugmatogram of a sample consisting of two parallel capillaries with their centers lying on a line making an angle of about 30° to the Z axis.

DESCRIPTION OF THE PREFERRED EMBODIMENTS

Figure 1:
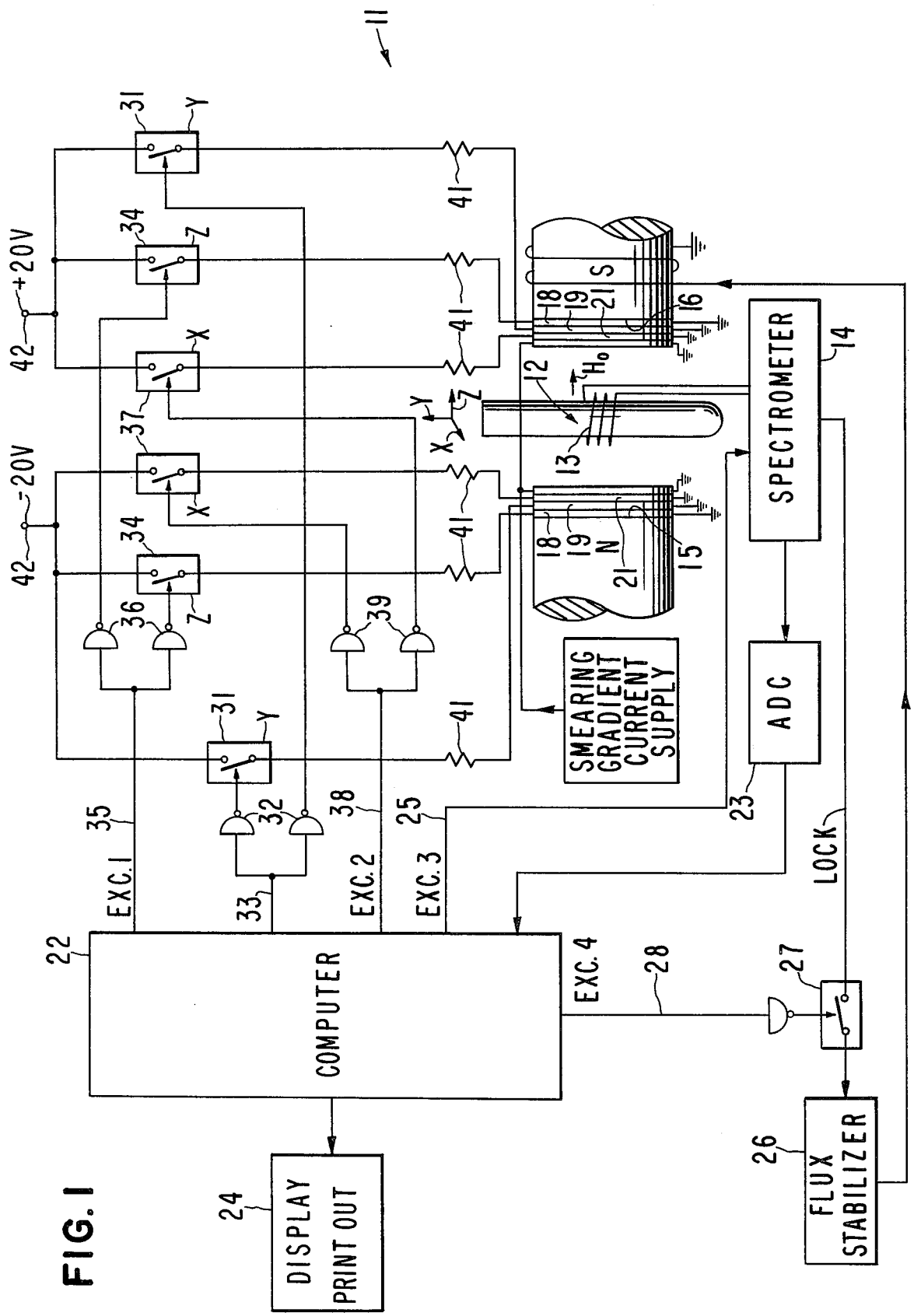
FIG. 1 is a schematic diagram, partly in block diagram form, of a gyromagnetic zeugmatographic resonance system incorporating features of the present invention.

Referring now to FIG. 1 there is shown a gyromagnetic resonance zeugmatographic apparatus 11 incorporating features of the present invention. Briefly, the apparatus 11 includes an object 12 occupying a region of space and having a region therein containing gyromagnetic resonators such as atomic nuclei or unpaired electrons. A zeugmatograph, i.e., a graphic representation of the spatial distribution of a property of the sample filled region of the object 12 is to be obtained. In a particular case utilized as an example, the object 12 comprises a glass test tube having a pair of glass capillary tubes therein, such glass capillaries being filled with water and the remaining volume of the test tube being filled with deuterium. In this example, the protons or hydrogen nuclei of the water samples comprise the gyromagnetic resonators.

A common transmitter and receiver coil 13 is disposed coaxially surrounding the tubular object 12, such coil being wound in axial alignment with the Y axis of the Cartesian coordinate system indicated in FIG. 1.

The single transmitreceive coil 13 is connected to a single coil gyromagnetic resonance spectrometer 14, such as a Varian Model CFT-20 or a Bruker Model SPX 4-100. The object 12 is disposed in a relatively intense unidirectional polarizing magnetic field $H_O$ produced between the pole pieces 15 and 16 of a relatively large electromagnet, such as a 15-inch diameter pole face electromagnet.

A first pair of gradient producing coils 18 are disposed on opposite pole faces 15 and 16 for producing a first linear gradient in the Z direction in the polarizing magnetic field $H_O$ which is directed in the Z direction. A second set of gradient coils 19 are wound on the pole faces 15 and 16 to produce, when energized, a second linear gradient in the Y direction. A third set of gradient coils 21 are disposed in the gap of the magnet coaxial with the Z direction to produce a linear gradient in the polarizing field along the X axis. Such a set of coils is shown in FIG. 2 of U.S. Pat. No. 3,199,021 and is merely rotated 90° about the Z axis of that figure to obtain the desired coil configuration.

The spectrometer 14 is interfaced with a digital computer 22, such as a Varian 620/L-100 having a 12 K bit memory, via the intermediary of an analog-to-digital converter 23. One output of the computer 22 is fed to a display print out 24 for obtaining zeugmatographs of the properties being imaged by the zeugmatographic apparatus 11. A synchronize and execute line 25 feeds signals from the computer 22 to the spectrometer 14 for placing the spectrometer under the control of the computer 22.

A field-frequency lock is provided by means of a flux stabilizer 26 and a nuclear control loop, such as a reference line in the sample region 12, for locking the intensity of the polarizing magnetic field $H_O$ to a predetermined gyromagnetic resonance frequency in the conventional manner. A switch 27 is provided for switching off the field-frequency lock by means of an output 28 derived from the computer 22.

The Y direction gradient producing coils 18 are simultaneously energized via a pair of switches 31 driven from a pair of inverters 32 from an output 33 of the computer 22. Similarly, the Z direction gradient coils 19 are energized via switches 34 driven by an output 35 of the computer 22 via the intermediary of inverters 36. The X direction gradient producing coils 21 are energized via switches 37 from an output 38 of the computer via inverters 39. Load resistors 41 are connected in circuit with each of the coils 18, 19 and 21 and their power supplies 42. The switches 31, 34 and 37 preferably have a very fast response time and comprise, for example, solid state DIP relays such as Teledyne Model 643-1 relays with a response time of less than 10 microseconds. The gradient producing coils 18, 19 and 21 are wound with sufficient turns such that approximately 70 milliamps through each of the coils is sufficient to produce a field gradient of approximately 1000 Hertz per centimeter in the sample region of the object 12. The flux stabilizer 26 comprises for example a Varian Model 3508 and an XL-100 field frequency module or a Model D-SN 15 Bruker external pulse proton lock with a long term stability of 1 Hertz.

Referring now to FIGS. 1 and 2 the operation of the zeugmatographic apparatus 11 will be described. In operation, the center radio frequency of the spectrometer and the intensity of the polarizing magnetic field $H_O$ are selected to produce gyromagnetic resonance of the sample material within the sample region of the body 12 to be imaged. In the situation where protons such as the hydrogen nuclei of water comprise the sample, the polarizing magnetic field and RF frequency of the spectrometer are chosen to excite nuclear magnetic resonance of the protons. This frequency is designated as $\omega_0$.

A 90° pulse of radio frequency magnetic field is applied to the sample with the vector of the applied alternating magnetic field being at right angles to the direction of the polarizing field, i.e., along the X axis. The intensity of the applied RF magnetic field is chosen so that during the duration of the pulse the nuclear magnetic moments of the sample protons are tipped 90° relative to the direction of the polarizing field $H_0$, i.e., they are tipped into the XY plane. The 90° pulse is indicated at 45 in FIG. 2.

Upon termination of the 90° pulse 45, namely at $t_0$, the gyromagnetic resonators, i.e., protons in this case, enter into a free induction decay resonance signal of the character indicated by waveform (b) of FIG. 2. Immediately upon termination of the 90° pulse the X gradient coils 21 are energized via an output derived from the computer at output 38 for superimposing an X gradient $g_x$ of approximately 500 Hertz per centimeter applied along the X axis. The X gradient coils are energized until a predetermined time $t_x$. Upon termination of the $t_x$ period, the X coils were de-energized and the Y gradient coils 18 are energized to superimpose a Y gradient, as of 700 Hertz per centimeter, along the Y axis of the sample. Upon termination of the time interval $t_y$, the Z gradient coils are energized and the Y gradient coils de-energized to produce a Z gradient as of 700 Hertz per centimeter, along the Z axis in the sample.

Concurrent with application of the Z gradient, namely at $t_x+t_y$, the detected resonance signal as shown in waveform (b) is sampled at equal intervals of time, as of 0.5 milliseconds, for a certain number N of samples. The relative time of $t_x$ to $t_y$ is varied from one free induction decay to the next so that over a set of N free induction decay signals the relative time $t_x$ to $t_y$ varies over a wide range.

The measured values of the free induction decay envelope made during the time period $t_z$ are converted from analog to digital form in the A to D converter 23 and stored in the memory of the computer. The process is then repeated with an interchange of the $t_z$ and $g_z$ portions of the cycle of waveform (a) with the $t_y$ and $g_y$ portions. During this $t_y$ period the free induction decay signals are sampled at equal intervals, as of 0.5 milliseconds, for N samples and N free induction decay signals with varying ratio of $t_x$ to $t_z$. Similarly, a third set of resonance data are obtained by interchanging the $g_z$ and $t_z$ periods for the $g_x$ and $t_x$ periods and the N number of free induction decay signals with varying ratios of $t_z$ to $t_y$ are each sampled at N sampling points during the $t_x$ period and this set of resonance data is converted to digital form and stored in the memory of the computer 22.

In case only a two-dimensional zeugmatogram, as shown in FIG. 4, is to be obtained, i.e., where the spin density of the sample region is projected onto a two-dimensional plane, such as the ZX plane, the other dimension, namely, the Y dimensional gradient $g_y$ and time period $t_y$ can be eliminated, i.e., reduced to zero intensity and zero time. Accordingly, substantial reduction in the storage and computational requirements of the computer 22 results with such simplification and in many cases the two-dimensional zeugmatogram is about as useful as the three-dimensional zeugmatogram.

To prevent a disturbance of the field frequency lock by the applied field gradients, it is desirable to interrupt the field-frequency control loop during the application of the field gradients for a period of approximately 100 milliseconds. This is obtained by the output of the computer at 28 which opens switch 27 and disables the field-frequency lock during the application of the gradients for a period of approximately 100 milliseconds. This brief interruption of the field-frequency lock does not adversely affect the field stability.

The maximum number of samples representing the zeugmatogram is limited by the available memory size of the computer 22. In general, a two dimensional image with N×N samples is desired. It is then necessary to record 2N free induction decay signals and to digitize each free induction decay signal into 2N samples. To permit the use of a fast Fourier transform computational routine in the computer 22, N is usually selected to be a power of two. Therefore, $4N^2$ memory locations would be required.

A well-known procedure to obtain a finer representation of a Fourier transform is the addition of a set of zeros to the array to be transformed, as is disclosed in the Journal of Magnetic Resonance, Vol. 11, Page 9 of 1973. A simple method which requires N(N+2) memory locations, only, but produces a N×N zeugmatogram is the following one: N free induction decay signals consisting of N samples each are recorded. To perform the first Fourier transformation, the N samples representing the free induction decay $k$, $[s_{ko}, s_{k1} \ldots s_{kN-1}]$ are transferred to a separate memory block and are augmented by N zero values, $[s_{ko}, s_{k1} \ldots s_{kN-1}, 0, 0 \ldots 0]$. The Fourier transform consists then of N complex values $\{\$_{ko}, \$_{k1} \ldots \$_{kN-1}\}$. The real parts, $\{R_{ko}, R_{k1} \ldots R_{N-1}\}$, are retained only and are stored back in place of the original free induction decay signal (FID). After transformation of all FID's, the matrix $\{R_{kj}\}$ is transposed, $\{R_{kj}\} \rightarrow \{R_{jk}\}$, and each row, augmented by N zero values, is Fourier transformed a second time. The absolute values of the $N^2$ complex Fourier coefficients are then utilized for the plot of a two-dimensional zeugmatogram. It can easily be shown that the neglect of the imaginary part after the first Fourier transformation does not cause any loss of information nor does it deteriorate the sensitivity.

The limited number of samples available to represent each FID calls for a careful selection of the center frequency, of the strength of the applied field gradients and of the sampling rate, such that the spatial resolution is sufficient without violating the sampling theorem and avoiding frequency foldover which can seriously distort a zeugmatogram. The dispersion-like parts as well must be represented. Dispersion mode signals have a much higher tendency to cause problems with frequency foldover than adsorption mode signals because of the much broader wings.

The number of samples N has been selected to be 64. This results in a total of 4096 sample values. The time required for one complete experiment including the data transformation is 8 minutes and the plotting of the 64 × 64 zeugmatogram on the teletype requires another 7 minutes.

In one example of nuclear magnetic resonance samples within the body 12, two parallel glass capillary tubes are filled with $H_2O$. The two capillaries, with an inner diameter of 1.0mm and a separating of the centers by 2.2mm are surrounded with $D_2O$. The object 12 was positioned in the magnet gap such that the capillary tubes are parallel to the Y axis and a line joining the centers of the two tubes is parallel to the Z axis.

Figure 3:
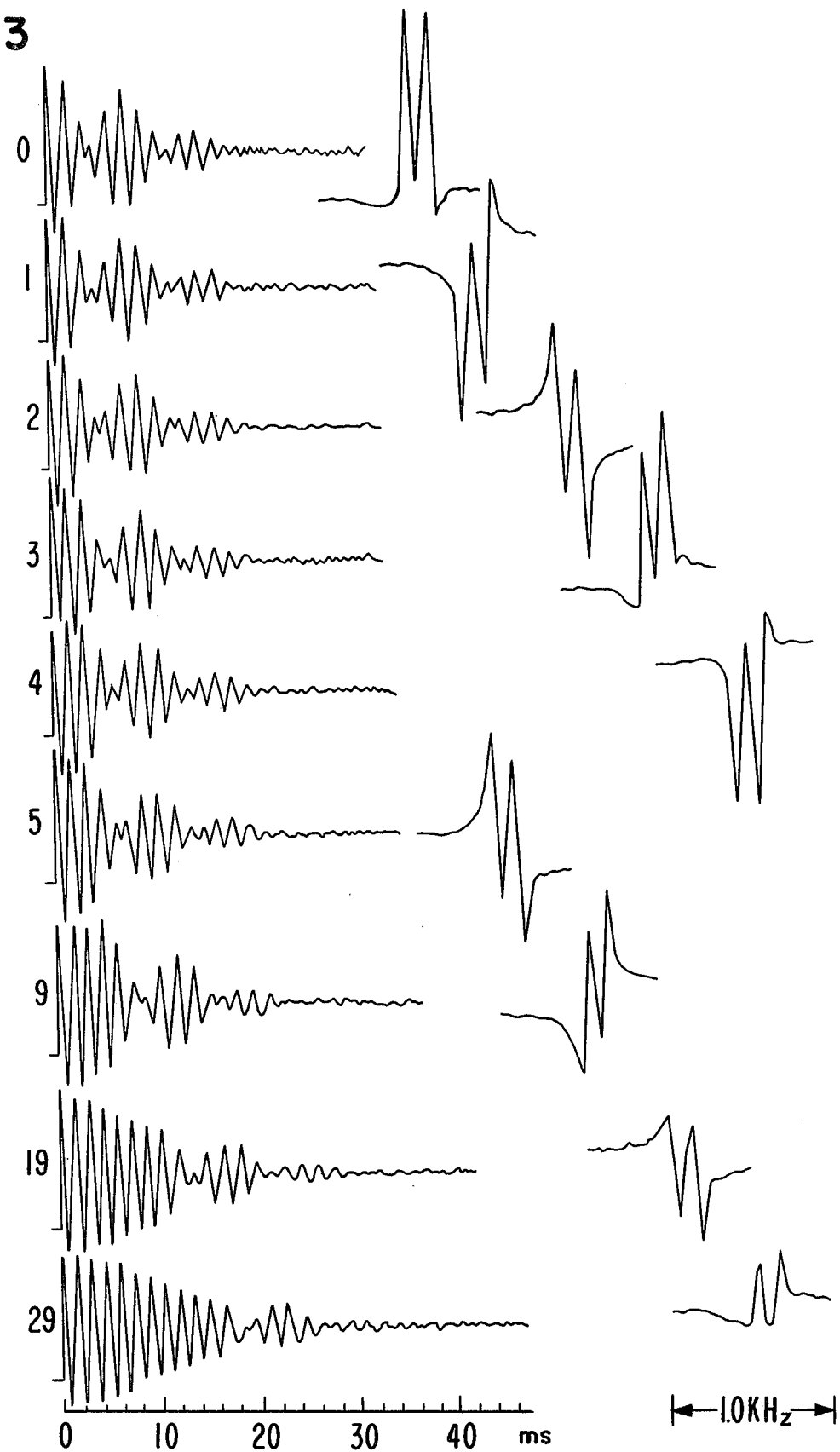
FIG. 3 depicts nine typical time domain free induction decay waveforms selected out of complete set of 64 decay signals with the corresponding Fourier transforms from the time domain into the frequency domain depicted on the right hand side of each of the decay signals.

FIG. 3 shows a series of typical free induction decay signals and their first Fourier transform depicted at the right of each free induction decay, numbered from top to bottom. During the first time interval $t_x$, a linear gradient of 500 Hertz per centimeter was applied along the X axis. The two capillary tubes are then in the same local field and the free induction decay remains unmodulated as is demonstrated by the first unmodulated portions of the free induction decay signal of FIG. 3. During the second time interval, a gradient of 700 Hertz per centimeter was applied along the Z axis. This causes the two capillary tubes to be in different local fields and it is responsible for the modulation of the free induction decay signals as well as for the double structure of the first Fourier transform with respect to $t_z$ shown on the right side of FIG. 3.

The phase and amplitude of this free induction decay signal after the first Fourier transformation map out the free induction decay at the end of the first time interval. A second Fourier transformation with respect to $t_x$ then yields the final two-dimensional Fourier zeugmatogram shown in FIG. 4.

For the map of FIG. 4, the total intensity range has been divided into eight equal intervals and a teletype character assigned to each interval. The intensity intervals are indicated in increasing order by the symbols (blank), (.), *, A, B, C, D, and E, respectively. This assignment is used for the other zeugmatograms of FIGS. 6 and 7.

Figure 5:
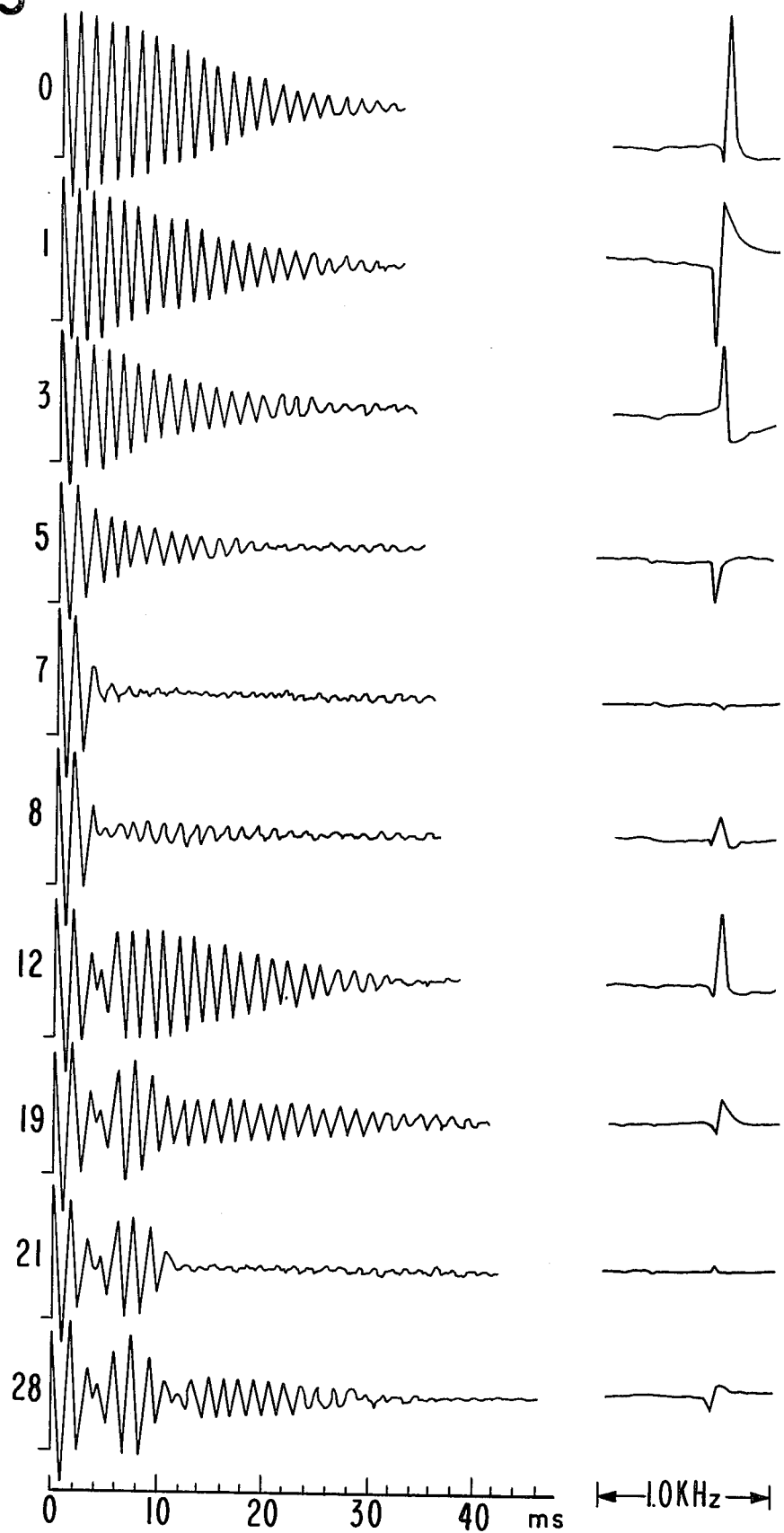
FIG. 5 is a plot of ten free induction decay signals in the time domain and their Fourier transforms shown on the right and obtained for the same conditions as employed in FIG. 3, but with the X and Z gradients interchanged in time and the signal being recorded during the time the X gradient is on, FIG. 6 is a zeugmatogram calculated from the data partially shown in FIG. 5 with the X and Z axes interchanged as compared to FIG. 4.

FIGS. 5 and 6 show a series of FID signals along with their first Fourier transforms and the Fourier zeugmatogram computed therefrom for the same experimental parameters and for the same samples as used for FIGS. 3 and 4, except that the two gradients have been interchanged in time. The first gradient is now along the Z axis and the second along the X axis. In this case, phase and amplitude of the first Fourier transform clearly show the beats caused by the different local fields of the two capillaries during the first time interval. FIGS. 4 and 6 represent images of the same sample effectively rotated by 90°.

Figure 8:
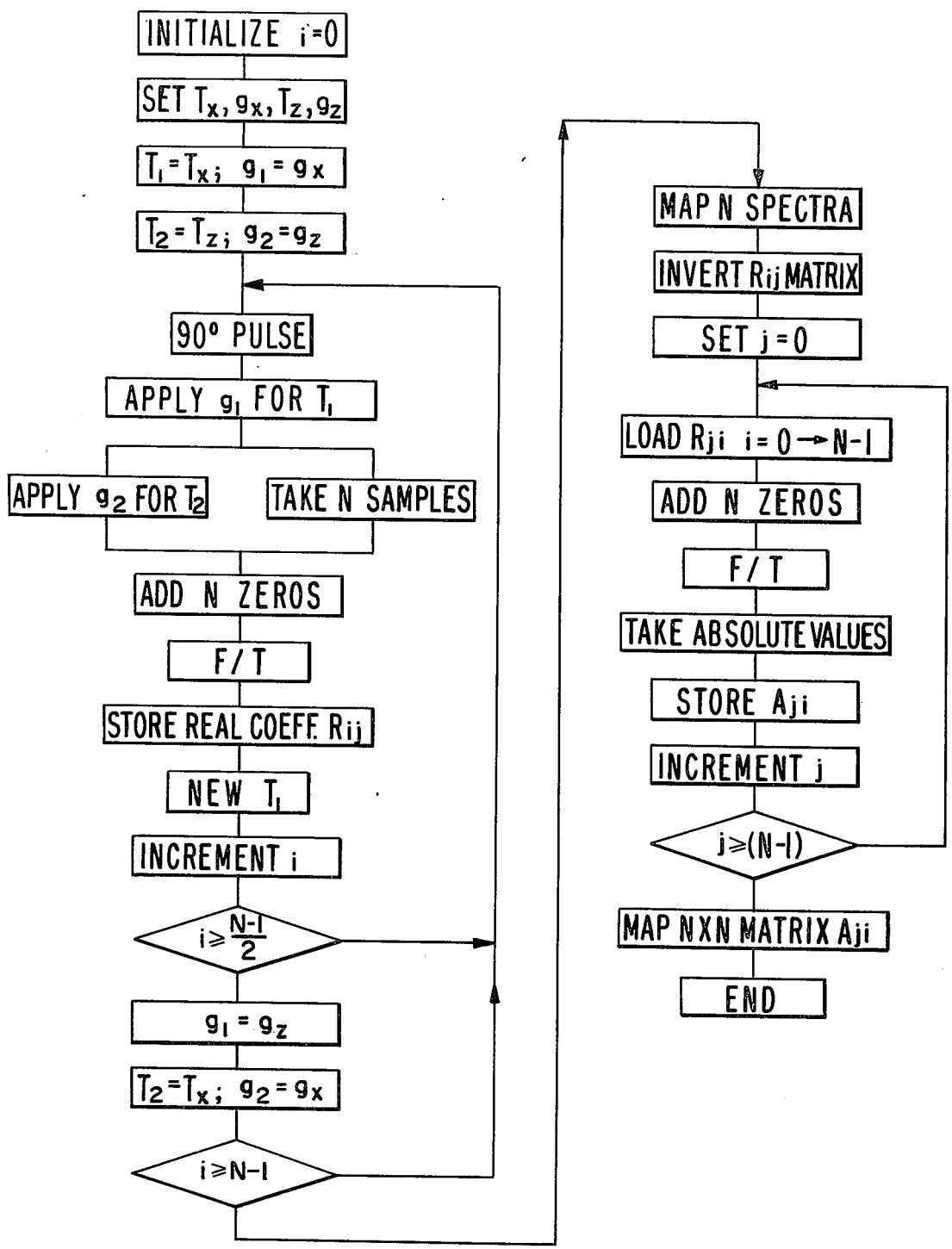
FIG. 8 is a flow chart for the experiment of the invention when carried out in two dimensions.

FIG. 8 discloses an embodiment of a flow chart for a computer program to control the spectrometer 11 and to acquire and process the data resonance and to display the two dimensional zeugmatograph of this invention.

The mathematical analysis of the Fourier transform zeugmatographic technique as hereinabove described is as follows: Although the experimental examples presented thus far and many of the future applications of this technique will be confined to merely two-dimensional imaging of a sample region, the theory will be developed for the more general three-dimensional case.

The principle of the technique is explained by means of FIG. 2. At time $t = 0$ a FID is generated by means of a short 90° pulse. In the course of this decay, three orthogonal linear magnetic field gradients, $g_x$, $g_y$, and $g_z$, are applied in succession. The z-component of the local magnetic field is then given by $$H_z(r) \begin{cases} = H_o + g_x x , \text{ for } 0 < t < t_x \\ = H_o + g_y y , \text{ for } t_x < t < t_x + t_y \\ = H_o + g_z z , \text{ for } t_x + t_y < t . \end{cases} \quad [1]$$

The FID is sampled in the third time interval as a function of $t_z = t - (t_x + t_y)$. It is at the same time a function of the preceeding time intervals $t_x$ and $t_y$. It will be denoted by $s(t) = s(t_x,t_y,t_z)$. The experiment is repeated for a full set of equally spaced $t_x$ and $t_y$ values. It will be shown in this section that the three-dimensional Fourier transform of $s(t)$ is a measure for the spatial spin density function $c(r) = c(x, y, z)$ and provides a three-dimensional image of the sample.

The observed signal $s(t)$ is composite of the contributions from the various volume elements of the sample and can be written as $$s(t) = \iiint c(r) s(r,t) dv \quad [2]$$

where $s(r,t)dv$ is the contribution from the volume element $dv = dxdydz$ at position $r$. For a single resonance, the function $s(r,t)$ can easily be found by solving Bloch equations. After phase-sensitive detection with the frequency $\omega_1$, the signal is given by $$s(r,t) = M_o \cos\{(\Delta + \eta_x x)t_x + (\Delta + \eta_y y)t_y + (\Delta + \eta_z z)t_z\} \quad [3]$$
$$\cdot \exp - \{t_x + t_y + t_z\}/T_2\} .$$

The resonance offset in the absence of a field gradient is given by $\Delta = -\gamma H_o - \omega_1$. The field gradients $\eta_k = -\gamma g_k$ are measured in frequency units. The setting of the phase-sensitive detector has been assumed arbitrarily to produce a cosine signal. It can easily be shown that the function $|\bar{c}(r)|$, which is plotted in a Fourier zeugmatogram, is independent of this arbitrary phase setting.

The three-dimensional Fourier transform of $s(t)$ is denoted by $S(\omega) = S(\omega_x,\omega_y,\omega_z)$ and is given by $$S(\omega) = \iiint dt_x dt_y dt_z s(t) \exp(-i\omega t). \quad [4]$$

It is again composite of the contributions from the various volume elements, $$s(\omega) = \iiint c(r) S(r,\omega) dv . \quad [5]$$

Here, $S(r,\omega)$ is the Fourier transform of $s(r,t)$ and is calculated to be $$S(r,\omega) = \frac{1}{2} \{G(\Delta + \eta_x x - \omega_x) G(\Delta + \eta_y y - \omega_y) G(\Delta + \eta_z z - \omega_z) \quad [6]$$
$$+ G(-\Delta - \eta_x x - \omega_x) G(-\Delta - \eta_y y - \omega_y) G(-\Delta - \eta_z z - \omega_z)$$

with the complex line shape function $$G(\omega) = A(\omega) + iD(\omega) = \frac{M_o/T_2}{(1/T_2)^2 + \omega^2} + i \frac{M_o \omega}{(1/T_2)^2 + \omega^2} \quad [7]$$

The second term in Eq. [6] which describes the contribution of the resonance near $-\Delta$ can be neglected whenever the line width is small compared to $\Delta$.

Equation [6] shows that the following identity holds, $$S(r,\omega) = S(0,\omega - \eta r) \quad [8]$$

where $\eta$ is a diagonal matrix with the elements $\eta_x$, $\eta_y$, and $\eta_z$. One obtains for $S(\omega)$ $$S(\omega) = \iiint c(r) S(0, \omega - \eta r) dv. \quad [9]$$

The frequency variable $\omega$ will now be replaced by a spatial variable $r'$ with $$\underline{\omega} = \Delta \underline{I} + \eta \underline{r}'. \qquad [10]$$

$\underline{I}$ is the unity vector (1,1,1). Then one obtains $$S(\underline{\omega}) = S(\Delta \underline{I} + \eta \underline{r}') = \bar{c}(\underline{r}') = \int\int\int c(\underline{r}) S(\underline{0}, \Delta \underline{I} + \eta (\underline{r}' - \underline{r})) dv. \qquad [11]$$

This integral is clearly a three-dimensional convolution integral. It represents a 'filtered' spin density function $\bar{c}(\underline{r}')$ obtained from the original spin density function $c(\underline{r})$ by a convolution with the line shape function $S(\underline{0}, \Delta \underline{I} + \eta \underline{r})$. By means of Eq. [6] and neglecting the contribution of the resonance near $-\Delta$, one obtains finally $$\bar{c}(\underline{r}') = \frac{1}{2}\int\int\int c(\underline{r}) G(\eta_x(x-x')) G(\eta_y(y-y')) G(\eta_z(z-z')) dv. \qquad [12]$$

The filtered spin density function $\bar{c}(\underline{r}')$ is a complex function. Its real and its imaginary parts both contain products of absorption- and dispersion-like parts and can have positive and negative function values. It is, therefore, advisable to compute and plot the absolute value $|\bar{c}(\underline{r}')|$ rather than plotting $\text{Re}\{\bar{c}(\underline{r}')\}$ or $\text{Im}\{\bar{c}(\underline{r}')\}$. For a sufficiently narrow resonance line or for sufficiently strong gradients $\eta_x$, $\eta_y$, and $\eta_z$, $|\bar{c}(\underline{r}')|$ is a good measure for $c(\underline{r}')$ itself. A modified technique is described below which permits one to completely separate absorption and dispersion mode signals.

In principle, it is also possible to utilize a quadrature phase detector which produces at its output $s(t)$ as well as the quadrature component $s'(t)$ which is given by equations similar to Eqs. [2] and [3] where the cosine function is replaced by a sine function. A linear combination of the two signals permits one to completely eliminate the contributions of the resonance near $-\Delta$. But the absorption and dispersion parts are not separated and the final result is equivalent to Eq. [12] except for an improvement of the sensitivity by a factor $\sqrt{2}$.

It is a major feature of the described technique that it does not involve one-dimensional projections of the three-dimensional spin density and that the Fourier transform of the spin density is directly measurable (except for the filtering caused by the natural line shape of the NMR signal). Many of the image reconstruction techniques which can be used for the prior art procedure utilize the fact that the Fourier transform of a one-dimensional projection of the spin density represents a one-dimensional cross section of the three-dimensional Fourier transform of the spin density function. All the cross sections which can be obtained in this way pass through the point $\underline{\omega} = \underline{0}$. The density of the obtained samples, therefore, is maximum for $\underline{\omega} = \underline{0}$ and decreases for increasing $|\omega|$. To obtain equally spaced samples representing the Fourier transform, it is at first necessary to go through an interpolation procedure. This is a prerequisite for the execution of the inverse Fourier transformation which produces the desired image. This ultimately implies that the low frequency components are obtained with higher precision than the high frequency components of the zeugmatogram. Therefore, the coarse features are better represented than the details. In some cases, this may be no disadvantage, and it may, in particular cases, even be desirable. This feature is inherent and is independent of the reconstruction procedure used. It also occurs in the reconstruction procedures based on Monte Carlo techniques as described e.g., by Gordon and Herman in Communications of the Association of Computing Machines, Vol. 14, Page 759, published in 1971.

In the Fourier technique of the present invention, on the other hand, an equal sample spacing of the Fourier transform is automatically obtained. The error distribution of a Fourier zeugmatogram is therefore homogeneous over the spatial and over the covered frequency range, in contrast to the prior art procedure. Coarse features and details are obtained with the same accuracy.

It is obvious that in any zeugmatographic technique the linearity and the homogeneity of the applied field gradients are of crucial importance. Very often, the shim coils provided in commercial spectrometer systems produce gradients which are not of sufficient linearity over the entire sample volume. It may, therefore, be advisable to add special gradient coils with improved linearity of the type disclosed in the Review of Scientific Instruments, Vol. 36, Page 1086, published in 1965.

The pulsed version of zeugmatography of the present invention relies on the instantaneous application and removal of field gradients. Eddy currents in pole caps and metal shields can cause response time problems which will result in serious distortions of the zeugmatogram. Special arrangements of gradient coils which minimize the rise and fall time of the gradients have been described by Tanner in the aforecited Review of Scientific Instruments article.

In many samples, the local magnetic field is already inhomogeneous due to variations of the susceptibility and due to the particular shape of the sample. It is then necessary to apply sufficiently strong gradients to overcome these 'natural' field gradients.

The pictorial representation could certainly be improved for visual effects by more sophisticated means, for example by means of a computer-controlled display.

It may be desirable to completely separate absorption- and dispersion-like parts as the absorption mode signal has an inherently higher resolution than the absolute value signal. The pure absorption mode may often produce a more accurate zeugmatogram. This separation can be achieved by the following modification of the basic technique. For each set of values $t_x$ and $t_y$, a series of four different experiments are performed and the four resulting FID's are averaged:

$$s_{av}(t) = \tfrac{1}{4}\{s^{+++}(t) + s^{++-}(t) + s^{+-+}(t) + s^{-++}(t)\} \qquad [13]$$

The four experiments differ by the signs of the applied field gradients and by the position of the reference frequency $\omega_1$ above or below resonance (negative or positive frequency offset $\Delta$). The notation of Eq. [13] is explained in Table 1. For this technique, it is not only necessary to switch gradients between the three phases of the FID but also to change the sign of the resonance offset $\Delta$. This can be achieved by an appropriate change of the dc magnetic field (during the off-time of the field-frequency lock) or better by a sudden change of the reference frequency of the phase-sensitive detector, $\omega_1$. Care must be taken to retain phase coherence during this frequency switching.

Table 1

| Time interval | Applied gradients η | | | Resonance offset Δ | | |
|---|---|---|---|---|---|---|
| | $t_x$ | $t_y$ | $t_z$ | $t_x$ | $t_y$ | $t_z$ |
| $s^{+++}(\underline{t})$ | $\eta_x$ | $\eta_y$ | $\eta_z$ | $|\Delta|$ | $|\Delta|$ | $|\Delta|$ |
| $s^{++-}(\underline{t})$ | $\eta_x$ | $\eta_y$ | $-\eta_z$ | $|\Delta|$ | $|\Delta|$ | $-|\Delta|$ |
| $s^{+-+}(\underline{t})$ | $\eta_x$ | $-\eta_y$ | $\eta_z$ | $|\Delta|$ | $-|\Delta|$ | $|\Delta|$ |
| $s^{-++}(\underline{t})$ | $-\eta_x$ | $\eta_y$ | $\eta_z$ | $-|\Delta|$ | $|\Delta|$ | $|\Delta|$ |

By means of Eq. [3] and utilizing the trigonometric addition theorems, one obtains for $s_{av}(\underline{r},\underline{t})$ $$s_{av}(\underline{r},\underline{t}) = M_o \cos((\Delta + \eta_x x)t_x) \cos((\Delta + \eta_y y)t_y) \cos((\Delta + \eta_z z)t_z) \quad [14]$$

$$\cdot \exp\{-(t_x + t_y + t_z)/T_2\} .$$

In this expression, the three variables $t_x$, $t_y$, and $t_z$ are separated. The three-dimensional Fourier transformation is now executed step by step and after each transformation, the imaginary part is eliminated. This is equivalent to a three-dimensional cosine transformation and gives the result $$S_{av}(\underline{\omega}) = \int\int\int c(\underline{r}) S_{av}(\underline{r},\underline{\omega}) \, dv \quad [15]$$

with $$S_{av}(\underline{r},\underline{\omega}) = \frac{1}{8} \{A(\Delta + \eta_x x - \omega_x) + A(-\Delta - \eta_x x - \omega_x)\} \quad [16]$$

$$\cdot \{A(\Delta + \eta_y y - \omega_y) + A(-\Delta - \eta_y y - \omega_y)\}$$

$$\cdot \{A(\Delta + \eta_z z - \omega_z) + A(-\Delta - \eta_z z - \omega_z)\}$$

This is a three-dimensional absorption mode signal and is the desired result. The contribution of the negative resonances can again be neglected, in general, and the function is converted into a function of $\underline{r}'$, $c_{av}(\underline{r}') = S_{av}(\underline{\omega})$ in analogy to Eqs. [11] and [12] and plotted as a function of $x$, $y$ and $z$.

In two dimensions, only a series of two experiments is necessary to determine $s_{av}(\underline{t})$:

$$s_{av}(\underline{t}) = \frac{1}{2} \{s^{++}(\underline{t}) + s^{+-}(\underline{t})\} \quad [17]$$

It has been mentioned above that a full three-dimensional zeugmatogram requires an amount of data which goes beyond the capacity of most small computers. The two-dimensional mapping described above with regard to FIGS. 4, 6 and 7, on the other hand, does not provide distinct cross sections but rather a projection of the three-dimensional spin density onto a two-dimensional plane. In many circumstances, a true cross section would be more desirable.

A cross section is obtained by the following technique: A quadratic or possibly higher order gradient is applied along the third direction, e.g., the y-axis. A suitable coil set for producing the quadratic gradient is shown in U.S. Pat. No. 3,199,021 at FIG. 5. Then, only the volume elements near $y=0$ will appreciably contribute to the signal amplitude. The remaining contributions will be smeared over a much larger spectral region and may be disregarded. For an additional smearing, it is also possible to average several FID's for various field gradients along the y-axis. For the selection of another cross section perpendicular to the y-axis, relative displacement is obtained between the magnetic field gradient and the sample along the y-axis.

A limited confinement to a cross sectional area is also possible by using very short receiver and transmitter coils.

An improved representation of a zeugmatogram may be obtained in the following way when the memory space is limited. Each FID is sampled to obtain M sample values which are Fourier transformed to produce a spectrum containing M samples. The sampling rate may be selected such that the interesting part of the spectrum covers a small portion of the total spectrum only. N significant, not necessarily equally spaced, samples of the spectrum are selected and stored for the subsequent second Fourier transformation. The number of relevent samples, N, can be considerably smaller than M. All other sample values can be discarded to save memory space. A similar procedure for the second Fourier transform is unfortunately not possible.

The measurement of the two- or three-dimensional distribution of spin-lattice relaxation times can be achieved by straight-forward extensions of the inversion-recovery technique, as disclosed in the Journal of Chemical Physics, Vol. 48, Page 3831, published in 1968, or of the saturation recovery method disclosed in the Journal of Chemical Physics, Vol. 55, Page 3604, published in 1971 and in Pure and Applied Chemistry, Vol. 32, Page 27, published in 1972. The spin system is prepared at $t = -T$ by means of a 180° pulse or by means of a saturating burst of rf pulses. The zeugmatogram obtained with a 90° pulse at $t = 0$ is then a measure for the spatial dependence of the recovery of the z-magnetization during the time T and permits determination of $T_1(\underline{r})$. An adaptation of the progressive saturation technique is also feasible.

More sophisticated extensions are conceivable, like the measurement of the spatial distribution of flow by measuring the echo height in a spin echo experiment in an inhomogeneous magnetic field. Various double resonance techniques can also be combined with zeugmatography, for example to single out the contributions of one particular resonance line in a more complex spin system. Fourier zeugmatography has the potential to adopt many of the well-known pulse techniques presently in use in high resolution NMR of liquids and of solids.

What is claimed is:

1. In a method of pulse gyromagnetic resonance zeugmatography, the steps of:
    a. inducing a transient gyromagnetic resonance signal from a sample of matter disposed in a region to be imaged by applying an RF pulse to induce a transverse magnetic moment of the sample;
    b. applying for a first time period a first magnetic field gradient upon the gyromagnetic sample of matter within said region after the end of said RF pulse and during the gyromagnetic resonance induced by said pulse;
    c. applying for a second time period a second magnetic field gradient relative to the said region after the end of said RF pulse and during the gyromagnetic resonance induced by said RF pulse wherein the ratio of said first time period to said second time period has a first value; and
    sampling, detecting and storing the induced transient gyromagnetic resonance signal after said first time period.

2. The method of claim 1 including the step of, Fourier transforming the stored transient gyromagnetic resonance signal data from the time domain into the frequency domain to obtain Fourier transformed gyromagnetic resonance spectral data from which to derive the image of said region.

3. The method of claim 2 including the step of forming the image of the property of said region from said Fourier transformed gyromagnetic resonance spectral data.

4. The method of claim 1 wherein said step of applying for a second time period a second magnetic field gradient includes applying a magnetic field gradient having a component which is orthogonal to said first magnetic field gradient.

5. The method of claim 4 including applying for a third period of time a third magnetic field gradient having an orthogonal component in relation to said first and second directions.

6. The method of claim 4 wherein the step of sampling, detecting and storing the induced transient resonance signal after said first time period includes detecting said transient signal during said second interval of time.

7. The method of claim 5 wherein the step of sampling, detecting and storing the induced transient gyromagnetic resonance signal after said first time period includes, detecting said transient signals during said third interval of time.

8. The method of claim 1 wherein the step of sampling detecting and storing the induced transient resonance signals comprises, the step of detecting the absorption mode resonance signal to the substantial exclusion of the dispersion mode resonance signal to derive absorption mode resonance data from which to derive the image of said region.

9. The method of claim 1 including the step of averaging said detected gyromagnetic resonance signals.

10. The method of claim 8 wherein said step of averaging includes the step of superimposing a smearing magnetic field gradient to average out the resonance of volume elements of said sample region located away from a desired plane defined by said smearing field gradient.

11. The method of claim 10 wherein the step of superimposing a smearing magnetic field gradient includes superimposing different values of said smearing magnetic field for different gyromagnetic signals within said plurality of gyromagnetic signals.

12. The method of claim 1 wherein the step of inducing the transient gyromagnetic resonance signals includes the step of, substantially inverting the alignment of the gyromagnetic resonators in the magnetic field prior to inducing each of said transient resonance signals.

13. The method of claim 10 wherein the step of superimposing a smearing magnetic field includes superimposing a second magnetic field gradient of higher order than that of said first mentioned magnetic field gradient upon the gyromagnetic sample to smear out the resonance of volume elements of said sample region located away from a desired plane defined by said second field gradient.

14. The method of claim 1 wherein the step of inducing the transient gyromagnetic resonance signals includes the step of saturating the resonances of the gyromagnetic resonators prior to inducing each of said transient resonance signals.

15. In an apparatus for gyromagnetic resonance zeugmatography:
pulse means for inducing a train of transient gyromagnetic resonance signals from a sample of matter disposed in a region to be imaged;
means for applying a magnetic field gradient upon the gyromagnetic sample of matter within said region during the induced resonance of the sample of matter;
means for rapidly changing the orientation of the magnetic field gradient relative to the region during said resonance signals of said train of induced resonances of the sample of matter; and
means for detecting the induced train of transient gyromagnetic resonance signals as a function of the duration of the different orientations of the magnetic field gradient in the region to derive gyromagnetic resonance data from which to derive an image of said region.

16. The apparatus of claim 15 including means for Fourier transforming the detected transient gyromagnetic resonance signal data from the time domain into the frequency domain to obtain Fourier transform gyromagnetic resonance spectral data from which to derive the image of said region.

17. The apparatus of claim 16 including means for forming the image of the property of said region from said Fourier transformed gyromagnetic resonance spectral data.

18. The apparatus of claim 15 wherein said means for changing the orientation of the magnetic field gradient during each of said transient signals includes, means for changing the direction of said magnetic field gradient relative to said region from a first relative direction for a first interval of time to a second relative direction which is generally orthogonal to said first direction for a second interval of time.

19. The apparatus of claim 18 including means for changing the direction of said magnetic field gradient from said second direction to a third direction orthogonally related to said first and second directions for a third interval of time.

20. The apparatus of claim 18 wherein said means for detecting the induced train of transient gyromagnetic resonance signals as a function of the change of the orientation of the magnetic field gradient includes, means for detecting said transient signals during said second interval of time.

21. The apparatus of claim 18 wherein said means for changing the magnetic field gradient from said first to said second direction includes means for changing the ratio of said first time interval to said second time interval.

22. The apparatus of claim 15 wherein said means for detecting the induced train of transient resonance signals comprises, means for detecting the absorption mode resonance signal to the substantial exclusion of the dispersion mode resonance signal to derive absorption mode resonance data from which to derive the image of said region.

23. The apparatus of claim 15 including means for superimposing a second magnetic field gradient of higher order than that of said first mentioned magnetic field gradient upon the gyromagnetic sample to smear out the resonance of volume elements of said sample region located away from a desired plane defined by said second field gradient, whereby the gyromagnetic resonance data obtained from which to derive the image more nearly conforms to a cross section of the sample region.

24. The apparatus of claim 15 wherein said means for inducing the train of transient gyromagnetic resonance signals includes, means for substantially inverting the alignment of the gyromagnetic resonators in the magnetic field prior to inducing each of said transient resonance signals.

25. The apparatus of claim 15 wherein said means for inducing the train of transient gyromagnetic resonance signals includes, means for saturating the resonances of the gyromagnetic resonators prior to inducing each of said transient resonance signals.

26. In a method of claim 1 further comprising repeating steps (a) through (d) wherein the ratio of said first time period to said second time period is changed from said first value.

27. In a method of claim 26 further comprising repeating steps (a) through (d) for a plurality of experiments wherein the ratio of said first time period to said second time period is different for each experiment.

28. In a method of gyromagnetic resonance zeugmatography, the steps of:
 repetitively inducing a transient gyromagnetic resonance signal from a sample of matter disposed in a region to be imaged;
 applying for a first period of time a first magnetic field gradient upon the gyromagnetic sample of matter within said region after inducing each said transient gyromagnetic resonance signal;
 applying for a second period of time a second magnetic field gradient relative to the said region after applying said first magnetic field gradient; and
 sampling, detecting, and storing said transient gyromagnetic resonance signals for a plurality of different ratios of said first period of time to said second period of time and analyzing said stored transient gyromagnetic resonance signals as a function of the different ratios of the time of application of said first and second magnetic field gradients in the region to derive gyromagnetic resonance data representative of an image of said region.

* * * * *